United States Patent [19]
Terada et al.

[11] Patent Number: 5,648,675
[45] Date of Patent: Jul. 15, 1997

[54] SEMICONDUCTOR DEVICE WITH HETEROJUNCTION

[75] Inventors: Norihiro Terada, Nara-ken; Yasuki Harada, Hyogo-ken, both of Japan

[73] Assignee: Sanyo Electric Co., Ltd., Osaka-fu, Japan

[21] Appl. No.: 521,114

[22] Filed: Aug. 29, 1995

[30] Foreign Application Priority Data

Sep. 2, 1994 [JP] Japan .................. 6-209750

[51] Int. Cl.$^6$ .................................. H01L 31/075
[52] U.S. Cl. .................. 257/458; 257/656; 257/52; 257/53; 136/258
[58] Field of Search .................. 257/52, 53, 458, 257/656, 449, 184, 51; 136/258

[56] References Cited

U.S. PATENT DOCUMENTS 4,946,514  8/1990  Nakagawa et al. ............ 257/656
5,213,628  5/1993  Noguchi et al. ............... 257/458
5,371,380 12/1994  Saito et al. ..................... 257/52

FOREIGN PATENT DOCUMENTS 0239055 11/1985  Japan ........................... 257/458

*Primary Examiner*—Sara W. Crane
*Assistant Examiner*—David B. Hardy
*Attorney, Agent, or Firm*—Darby & Darby

[57] ABSTRACT

In the present invention, atoms are implanted into the surface of at least a crystalline silicon semiconductor of one conductivity type in forming a heterojunction, thereby to bring the surface of the crystalline silicon semiconductor into amorphous to form a substantially intrinsic amorphous silicon layer. An amorphous silicon layer or a microcrystalline silicon layer of an opposite conductivity type is deposited on the amorphous silicon layer, whereby a heterojunction interface is formed in a region deeper than a deposition interface.

11 Claims, 3 Drawing Sheets

SEMICONDUCTOR DEVICE WITH HETEROJUNCTION

BACKGROUND OF THE INVENTION

1. Field of the Invention

The present invention relates to a semiconductor device having a heterojunction such as a photovoltaic device for directly converting light energy of solar light or the like into electrical energy, a thin film transistor, a bipolar transistor, or a diode and a method of fabricating the same.

2. Description of the Prior Art

As disclosed in U.S. Pat. No. 4,496,788, a heterojunction type photovoltaic device in which an amorphous silicon layer or a microcrystalline silicon layer is stacked on a monocrystalline or polycrystalline silicon substrate has been known.

A heterojunction using the crystalline silicon and the amorphous silicon layer or the microcrystalline silicon layer performs the function of joining the crystalline silicon and the amorphous silicon layer or the microcrystalline silicon layer by doping impurities into the amorphous silicon layer or the microcrystalline silicon layer.

However, the amorphous silicon layer or the microcrystalline silicon layer into which impurities are doped has the problem that the defects thereof are increased by the doping, degrading the heterojunction interface characteristics thereof. The degradation of the junction interface characteristics results in the recombination of carriers when the amorphous silicon layer or the microcrystalline silicon layer is used for the photovoltaic device. As a result, high conversion efficiency is not obtained.

In order to solve the problem, it has been proposed in U.S. Pat. No. 5,213,628 that a substantially intrinsic amorphous silicon layer is interposed between a crystalline silicon substrate and an amorphous silicon layer, thereby to reduce the defects at the interface therebetween to improve the heterojunction interface characteristics.

As the above described method, a method of depositing an amorphous silicon layer on a crystalline silicon substrate by chemical vapor deposition (CVD) or the like has been used. Therefore, the junction interface characteristics of the amorphous silicon layer depends on the cleanness on the surface of the crystalline silicon substrate before the deposition. Accordingly, careful attention must be given to the cleaning on the surface of the crystalline silicon substrate. However, some problems arise. For example, good junction interface characteristics are not frequently obtained depending on the forming conditions of the amorphous silicon layer.

SUMMARY OF THE INVENTION

The present invention has been made in order to solve the above described conventional problems and has for its object to provide a semiconductor device in simple steps and capable of obtaining stable heterojunction characteristics.

A first semiconductor device according to the present invention comprises a crystalline semiconductor layer of one conductivity type composed of a crystalline silicon semiconductor, a substantially intrinsic amorphous semiconductor layer composed of an amorphous silicon semiconductor or a microcrystalline silicon semiconductor formed by implanting atoms into the crystalline silicon semiconductor on the surface of the crystalline semiconductor layer, and an amorphous semiconductor layer of an opposite conductivity type composed of an amorphous silicon semiconductor or a microcrystalline silicon semiconductor deposited on the intrinsic amorphous semiconductor layer.

A second semiconductor device according to the present invention comprises a crystalline semiconductor layer of one conductivity type composed of a crystalline silicon semiconductor, a substantially intrinsic first amorphous semiconductor layer composed of an amorphous silicon semiconductor or a microcrystalline silicon semiconductor formed by implanting atoms into the crystalline silicon semiconductor on the surface of the crystalline semiconductor layer, a second amorphous semiconductor layer of an opposite conductivity type composed of an amorphous silicon semiconductor or a microcrystalline silicon semiconductor deposited on the first amorphous semiconductor layer, a transparent electrode layer formed on the second amorphous semiconductor layer, a substantially intrinsic third amorphous semiconductor layer composed of an amorphous silicon semiconductor or a microcrystalline silicon semiconductor formed by implanting atoms into the crystalline silicon semiconductor on the reverse surface of the crystalline semiconductor layer, a fourth amorphous semiconductor layer of one conductivity type composed of an amorphous silicon semiconductor or a microcrystalline silicon semiconductor deposited on the third amorphous semiconductor layer, and a back electrode layer formed on the fourth amorphous semiconductor layer. And a heterojunction interface is formed in a region deeper than a deposition interface.

A method of fabricating a semiconductor device according to the present invention is characterized by comprising the steps of implanting atoms into the surface of a crystalline semiconductor layer of one conductivity type composed of a crystalline silicon semiconductor, forming a substantially intrinsic amorphous semiconductor layer composed of an amorphous silicon semiconductor or a microcrystalline silicon semiconductor, and depositing an amorphous semiconductor layer of an opposite conductivity type composed of an amorphous silicon semiconductor or a microcrystalline silicon semiconductor on the amorphous semiconductor layer. The atoms implanted into the surface of the crystalline semiconductor layer are selected from hydrogen (H), silicon (Si), argon (At), fluorine (F), germanium (Ge) and carbon (C).

As described in the foregoing, in the present invention, the atoms are implanted into the surface of at least the crystalline silicon semiconductor of one conductivity type, thereby to bring the surface of the crystalline silicon semiconductor into amorphous to form the substantially intrinsic amorphous silicon layer. The amorphous silicon layer or the microcrystalline silicon layer of the opposite conductivity type is deposited on the intrinsic amorphous silicon layer, whereby a heterojunction interface is formed in a region deeper than a deposition interface. Defects due to impurities which are problems at the deposition interface are prevented by such simple steps, thereby to make it possible to reduce the recombination of carriers to improve the junction characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description is now made of embodiments of the present invention with reference to the drawings.

Figure 1A:
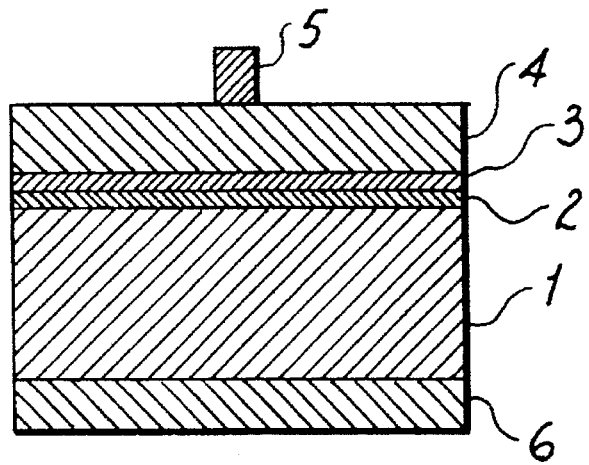
FIG. 1A is a cross-sectional view showing an embodiment in which the present invention is applied to a photovoltaic device.

FIG. 1 is a cross-sectional view showing an embodiment in which the present invention is applied to a photovoltaic device. As shown in FIG. 1, an amorphous silicon layer 2 formed by implanting atoms such as hydrogen is provided on the surface of a p-type or n-type substrate 1 composed of a monocrystalline or polycrystalline silicon semiconductor having a thickness in the range of several micrometers to hundreds of micrometers. Specifically, when the atoms such as hydrogen are implanted into the surface of the substrate 1 composed of crystalline silicon, crystals are destroyed, whereby a region where the atoms are implanted degenerates into amorphous silicon or microcrystalline silicon. In the present embodiment, the region which degenerated is used as the amorphous silicon layer 2. The amorphous silicon layer 2 is formed by exposing the surface of the substrate 1 to hydrogen plasma, thereby to introduce hydrogen into the surface of the substrate 1 to form hydrogenated amorphous silicon, for example. Although p-type or n-type impurities which have been introduced into the substrate 1 are included in the amorphous silicon layer 2, an impurity concentration of the amorphous silicon layer 2 is the same as that of the underlying substrate 1.

For example, when n-type monocrystalline silicon having conductivity of $-1\Omega$ cm is used as the underlying substrate 1, approximately $3\times10^{15}$ cm$^{-3}$ of phosphorous (P) is included in the amorphous silicon layer 2. When impurities are included to such an extent, the dark conductivity of the amorphous silicon layer 2 becomes $10^{-10}$ $(\Omega$ cm$)^{-1}$. On the other hand, the dark conductivity of intrinsic (i-type) amorphous silicon formed by a plasma CVD method is $10^{-10}$ $(\Omega)^{-1}$. Even if impurities are included in the amorphous silicon layer 2 from the underlying substrate 1, therefore, the amorphous silicon layer 2 can be regarded as intrinsic (i-type) amorphous silicon.

The implantation of the atoms is so controlled that the thickness of the amorphous silicon layer 2 is in the range of 10 to 500 Å and preferably, 50 to 200 Å. An amorphous silicon layer 3 of a conductivity type opposite to that of the substrate 1, that is, an n-type or p-type amorphous silicon layer 3 is formed on the amorphous silicon layer 2 by a plasma CVD method. Approximately $-5\times10^{20}$ cm$^{-3}$ of impurities such as phosphorous (P) or boron(B) are included in the amorphous silicon layer 3. The amorphous silicon layer 3 is deposited on the amorphous silicon layer 2 to a thickness in the range of 10 to 500 Å and preferably, 50 to 200 Å.

Furthermore, a transparent electrode 4 having a thickness of ~700 Å composed of a transparent conductive oxide film such as $SnO_2$, ITO (Indium Tin Oxide) or ZnO is provided so as to cover an exposed surface of the amorphous silicon layer 3, and a collecting electrode 5 composed of silver (Ag) is formed on the transparent electrode 4.

Additionally, a back electrode 6 having a thickness of ~2 μm composed of aluminum (Al) is formed on the reverse surface of the substrate 1, thereby to obtain a photovoltaic device according to the present invention.

In the photovoltaic device according to the present invention, the atoms are implanted into the surface of at least the crystalline silicon semiconductor so that the surface of the crystalline silicon semiconductor is brought into amorphous, to form the amorphous silicon layer 2. The amorphous silicon layer 3 is deposited on the amorphous silicon layer 2, whereby a heterojunction interface is formed in a region deeper than a deposition interface. As a result, defects due to the impurities which are problems at the deposition interface are solved. Further, the heterojunction interface which greatly affects characteristics even if the deposition interface is not clean becomes a region different from the deposition interface, thereby to obtain stable characteristics irrespective of the cleanness on the surface of the crystalline silicon substrate.

In the photovoltaic device according to the present invention, the device characteristics are stabilized and the yield can be increased from 50 to 80%, as compared with a photovoltaic device produced in the above described conventional method.

One example of a fabricating method in which the present invention is applied to a photovoltaic device will be described with reference to FIG. 2. FIG. 2 is a cross-sectional view showing the fabricating method according to the present invention by steps.

n-type monocrystalline silicon having conductivity of $\sim 1\Omega$ cm and having a thickness of 300 μm is first prepared, and is used as a substrate 1. The substrate 1 is cleaned by a usual method, after which the substrate 1 is arranged in an RF plasma apparatus. The surface of the substrate 1 is exposed to hydrogen plasma, thereby to introduce hydrogen into crystalline silicon to form hydrogenated amorphous silicon under the conditions of a substrate temperature of 120 ° C., a hydrogen gas flow rate of 100 SCCM (Standard Cubic Centimeters per Minute), a pressure of 0.5 Torr, and an RF power of 100 to 300 mW/cm², thereby to form an amorphous silicon layer 2 (see FIG. 2A). Hydrogen of 0.5 to 30% and typically, 2 to 10% hydrogen is introduced into the amorphous silicon layer 2 by the hydrogen plasma processing.

Although phosphorous (P) which has been introduced into the substrate 1 is included in the amorphous silicon layer 2 as described above, the impurity concentration of the amorphous silicon layer 2 is the same as that of the underlying substrate 1. Approximately $3\times10^{15}$ cm$^{-3}$ of phosphorous (P) is included in the amorphous silicon layer 2. When impurities are included to such an extent, the dark conductivity of the amorphous silicon layer 2 becomes $10^{-10}$ $(\Omega$ cm$)^{-1}$. Therefore, the amorphous silicon layer 2 can be regarded as intrinsic (i-type) amorphous silicon.

The implantation of the atoms is so controlled that the thickness of the amorphous silicon layer 2 is in the range of 10 to 500 Å and preferably, 50 to 200 Å.

Figure 2A:
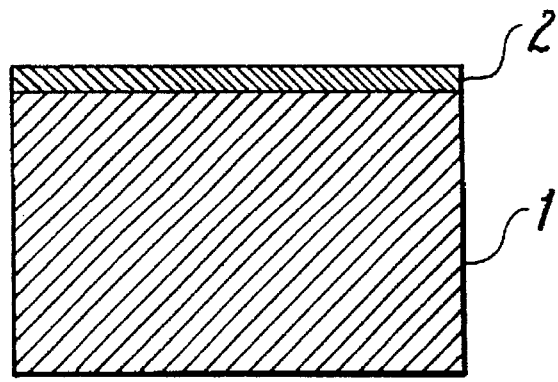
FIGS. 2A to 2D are cross-sectional views showing a fabricating method according to the present invention by steps.
Figure 2B:
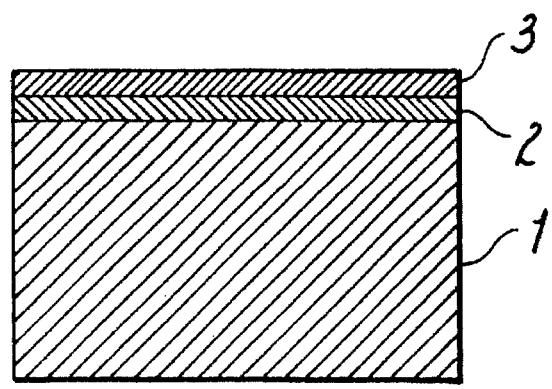

A p-type amorphous silicon layer 3 is then deposited on the amorphous silicon layer 2 having a thickness in the range of 10 to 500 Å and preferably, 50 to 200 Å by a plasma CVD method (see FIG. 2B). The conditions at this time are a substrate temperature of 120 ° C., an $SiH_4$ gas flow rate of 5 SCCM, a $B_2H_6$ gas flow rate of 0.1 SCCM, an $H_2$ gas flow rate of 100 SCCM, a pressure of 0.2 Torr, and an RF power of 30 mW/cm². Approximately $-1\times10^{21}$ cm$^{-3}$ of boron (B) is included in the amorphous silicon layer 3.

Figure 2C:
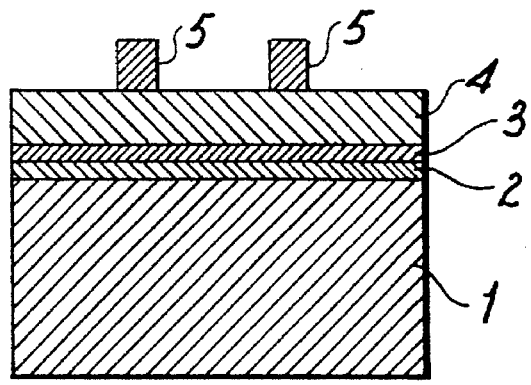

Furthermore, a transparent electrode 4 having a thickness of ~700 Å composed of a transparent conductive oxide film such as $SnO_2$, ITO or ZnO is provided so as to cover an exposed surface of the amorphous silicon layer 3, and a collecting electrode 5 composed of silver (Ag) is formed on the transparent electrode 4 by vacuum evaporation using a metal mask (see FIG. 2C).

Figure 2D:
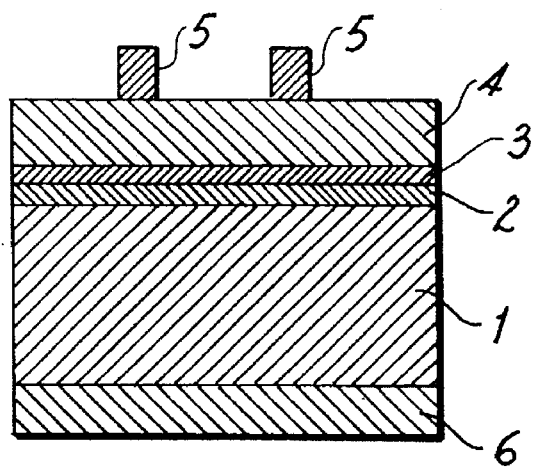

Additionally, a back electrode 6 having a thickness of ~2 μm composed of aluminum (Al) is formed on the reverse surface of the substrate 1 by vacuum evaporation, to obtain a photovoltaic device according to the present invention (see FIG. 2D).

ITO, ZnO, $SnO_2$, etc. and silver (Ag), gold (Au), etc. having high reflectivity may be stacked on the whole or a part of the back electrode 6 so as to improve the reflectivity of the back electrode 6.

Although the amorphous silicon layer 2 is formed by hydrogen plasma in the above described embodiment, the surface of the substrate can be brought into amorphous similarly by the other method. For example, the surface of the substrate can be brought into amorphous by using an ion implanting apparatus or an ion shower apparatus. In the ion shower apparatus, hydrogen gas is introduced into the surface of the substrate, and a current of 5 to 20 $\mu A/cm^2$ is caused to flow for three minutes at an accelerating voltage of 3 to 20 keV, thereby to obtain the amorphous silicon layer 2.

Furthermore, it is possible to also form an amorphous silicon layer by implanting atoms other than hydrogen. For example, it is possible to form an amorphous silicon layer on the surface of the substrate 1 by implanting atoms such as silicon (Si), argon (Ar), fluorine (F), germanium (Ge) and carbon (C). For example, the silicon (Si) atoms, the germanium (Ge) atoms, the carbon (C) atoms, the fluoride (F) atoms, and the argon (At) atoms can be respectively implanted by ion implantation or plasma processing using $SiH_4$ gas, $SiF_4$ gas or the like, ion implantation or plasma processing using $GeH_4$ gas, $GeF_4$ gas or the like, plasma processing using $CH_4$ gas, $CF_4$ gas or the like, ion implantation, plasma processing or ion shower using $F_2$ gas, HF gas or the like, and ion implantation, plasma processing or ion shower using Ar gas.

As the distribution of the atoms in amorphous silicon by the implantation, an arbitrary distribution can be obtained by adjusting the energy of the atoms.

An i-type amorphous silicon layer may be further provided between the amorphous silicon layer 2 and the amorphous silicon layer 3. Particularly when the thickness of the amorphous silicon layer 2 is as thin as 50 Å or less, it is better to interpose an i-type amorphous silicon therebetween.

Figure 3:
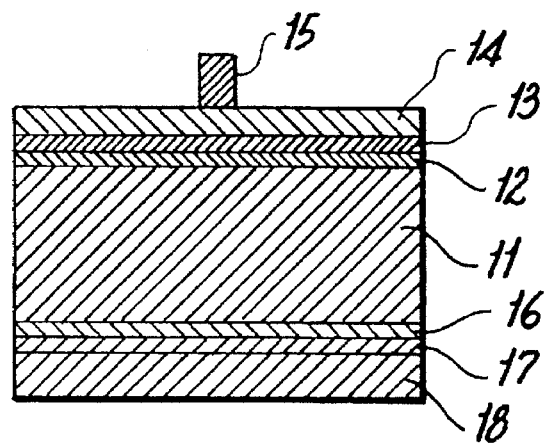
FIG. 3 is a cross-sectional view showing another embodiment in which the present invention is applied to a photovoltaic device.

FIG. 3 is a cross-sectional view showing another embodiment in which the present invention is applied to a photovoltaic device. As shown in FIG. 3, an amorphous silicon layer 12 formed by implanting atoms such as hydrogen as in FIGS. 1 and 2 is provided on the surface of an n-type substrate 11 composed of a monocrystalline silicon semiconductor having a thickness in the range of tens of micrometers to hundreds of micrometers.

An amorphous silicon layer 13 of a conductivity type opposite to that of the substrate 11, that is, a p-type amorphous silicon layer 13 is formed on the amorphous silicon layer 12 by a plasma CVD method or the like. The amorphous silicon layer 13 is deposited on the amorphous silicon layer 12 having a thickness in the range of 10 to 500 Å and preferably, 50 to 200 Å. Further, a transparent electrode 14 having a thickness of ~700 Å composed of a transparent conductive oxide film such as $SnO_2$, ITO or ZnO is provided so as to cover an exposed surface of the amorphous silicon layer 13, and a collecting electrode 15 composed of silver (Ag) is formed on the transparent electrode 14.

On the other hand, in the present embodiment, an amorphous silicon layer 16 formed by implanting atoms such as hydrogen is also provided on the reverse surface of the substrate 11. The amorphous silicon layer 16 is formed by exposing the surface of the substrate 11 to hydrogen plasma, thereby to introduce hydrogen into the surface of the substrate 1, for example, similarly to the above described amorphous silicon layer 12. Although n-type impurities which have been introduced into the substrate 1 are included in the amorphous silicon layer 16, the impurity concentration of the amorphous silicon layer 16 is the same as that of the underlying substrate 11. Accordingly, the amorphous silicon layer 16 can be regarded as intrinsic (i-type) amorphous silicon, as described above.

Implantation of the atoms is so controlled that the thickness of the amorphous silicon layer 16 is in the range of 10 to 500 Å and preferably, 50 to 200 Å.

An amorphous silicon layer 17 of the same conductivity type as that of the substrate 11, that is, an n-type amorphous silicon layer 17 is formed on the amorphous silicon layer 16 by a plasma CVD method or the like. The amorphous silicon layer 17 is deposited on the amorphous silicon layer 16 having a thickness in the range of 10 to 10000 Å and preferably, 500 to 2000 Å. A back electrode 18 having a thickness of ~2 μm composed of aluminum (Al) is formed on the amorphous silicon layer 17, thereby to obtain a photovoltaic device according to the present invention. The intrinsic amorphous silicon layer 16 and the n-type amorphous silicon layer 17 are thus formed on the reverse surface of the substrate 11, whereby recombination of holes occurring between the back electrode 18 and the substrate 11 is reduced.

The above described photovoltaic device is formed in the same method as the above described method. The conditions of the n-type amorphous silicon layer 17 are a substrate temperature of 120° C., an $SiH_4$ gas flow rate of 10 SCCM, a $PH_3$ gas flow rate of 0.1 SCCM, an $H_2$ gas flow rate of 100 SCCM, a pressure of 0.2 Torr, and an RF power of 30 $mW/cm^2$.

Figure 4:
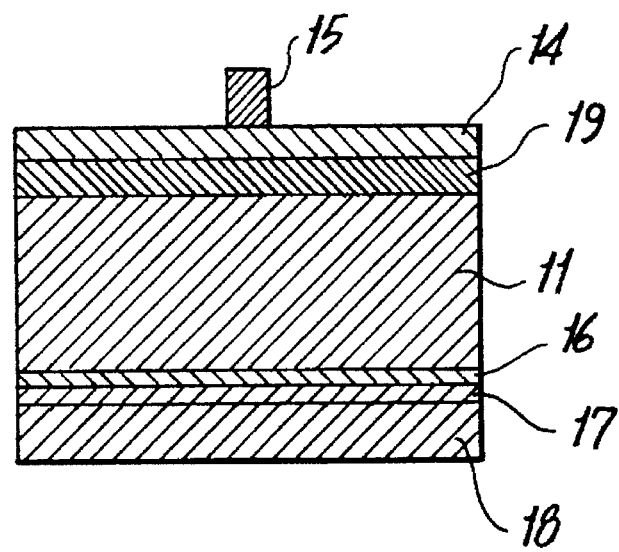
FIG. 4 is a cross-sectional view showing still another embodiment in which the present invention is applied to a photovoltaic device.

FIG. 4 is a cross-sectional view showing still another embodiment in which the present invention is applied to a photovoltaic device. As shown in FIG. 4, a p-type semiconductor layer 19 formed by diffusing boron (B) is provided on the surface of an n-type substrate 11 composed of a monocrystalline silicon semiconductor having a thickness in the range of tens of micrometers to hundreds of micrometers.

A transparent electrode 14 having a thickness of ~700 Å composed of a transparent conductive oxide film such as $SnO_2$, ITO or ZnO is provided so as to cover the p-type semiconductor layer 19, and a collecting electrode 15 composed of silver (Ag) is formed on the transparent electrode 14.

On the other hand, also in the present embodiment, an amorphous silicon layer 16 formed by implanting atoms such as hydrogen is provided on the reverse surface of the substrate 11, as in the embodiment shown in FIG. 3. The amorphous silicon layer 16 is formed by exposing the surface of the substrate 11 to hydrogen plasma, thereby to introduce hydrogen into the surface of the substrate 11, for example, similarly to the above described amorphous silicon layer 12. Although n-type impurities which have been introduced into the substrate 11 are included in the amorphous silicon layer 16, the impurity concentration of the amorphous silicon layer 16 is the same as that of the underlying substrate 11, whereby the amorphous silicon layer 16 can be regarded as intrinsic (i-type) amorphous silicon.

The implantation of the atoms is so controlled that the thickness of the amorphous silicon layer 16 is in the range of 10 to 500 Å and preferably, 50 to 200 Å.

An amorphous silicon layer 17 of the same conductivity type as that of the substrate 11, that is, an n-type amorphous silicon layer 17 is formed on the amorphous silicon layer 16 by a plasma CVD method or the like. The amorphous silicon layer 17 is deposited on the amorphous silicon layer 16 having a thickness in the range of 10 to 10000 Å and preferably, 500 to 2000 Å. A back electrode 18 having a thickness of ~2 μm composed of aluminum (Al) is formed on the amorphous silicon layer 17, thereby to obtain a photovoltaic device according to the present invention.

Figure 5:
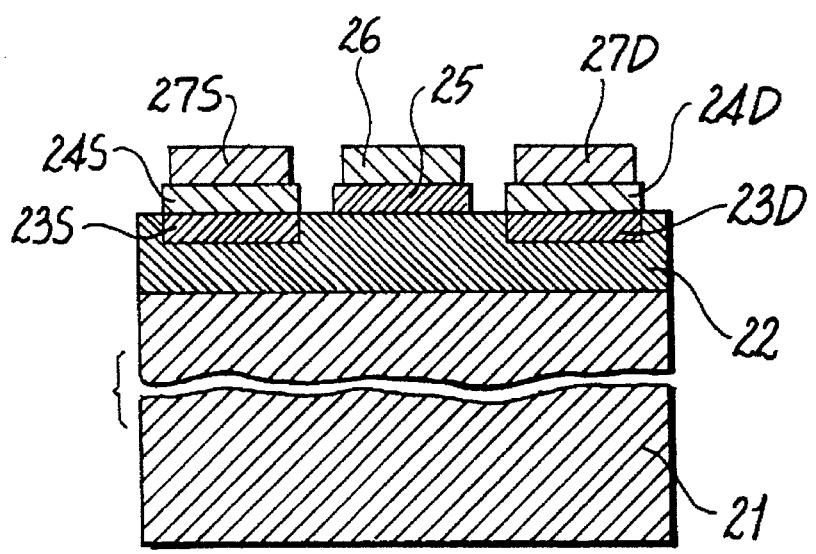
FIG. 5 is a cross-sectional view showing an embodiment in which the present invention is applied to a thin film transistor.

FIG. 5 is a cross-sectional view showing an embodiment in which the present invention is applied to a thin film transistor. As shown in FIG. 5, a region excluding regions to be a source region and a drain region of a polycrystalline silicon thin film 22 formed on a glass substrate 21 is masked, and atoms are implanted by hydrogen plasma, whereby amorphous silicon layers 23S and 23D are respectively formed in the regions to be a source region and a drain region. n-type amorphous silicon layers 24S and 24D are respectively formed on the amorphous silicon layers 23S and 23D, whereby a source region and a drain region are provided. A gate electrode 26 is formed on the polycrystalline silicon thin film 22 through a gate insulating film 25, and a source electrode 27S and a drain electrode 27D are respectively formed on the source region 24S and the drain region 24D, thereby to obtain a thin film transistor according to the present invention.

In the thin film transistor according to the present embodiment, the atoms are implanted into the surface of at least the polycrystalline silicon thin film 22, whereby the surface of the polycrystalline silicon thin film 22 is brought into amorphous, to form an amorphous silicon layer. An amorphous silicon layer into which impurities are doped is deposited on the formed amorphous silicon layer, whereby a heterojunction interface is formed in a region deeper than a deposition interface. As a result, defects due to impurities which are problems at the deposition interface are solved.

Although in the above described embodiments, the amorphous silicon layer is provided on the amorphous silicon layer formed by implanting atoms on the substrate, a microcrystalline silicon layer can be also used.

The present invention can be used in an emitter region of a heterojunction type bipolar transistor in addition to the above described embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a crystalline semiconductor layer of a crystalline silicon semiconductor of one conductivity type;

a substantially intrinsic amorphized first amorphous semiconductor layer of an amorphous silicon semiconductor or a microcrystalline silicon semiconductor having dopant of the same kind and substantially the same amount as that in said crystalline silicon semiconductor and located on one surface of the crystalline semiconductor layer; and a deposited second amorphous semiconductor layer of an amorphous silicon semiconductor or a microcrystalline silicon semiconductor on said first amorphous semiconductor layer.

2. The semiconductor device according to claim 1, wherein said second amorphous semiconductor layer is of an opposite conductivity type.

3. The semiconductor device according to claim 1, further comprising a transparent electrode layer on said second amorphous semiconductor layer of the opposite conductivity type, and an electrode layer on the reverse surface of said crystalline semiconductor layer.

4. The semiconductor device according to claim 1, wherein the thickness of said first amorphous semiconductor layer is in the range of 10 to 500 Å, and the thickness of said second amorphous semiconductor layer is in the range of 10 to 500 Å.

5. The semiconductor device according to claim 1, further comprising a substantially intrinsic amorphous silicon layer between said first substantially intrinsic amorphous semiconductor layer and said second amorphous semiconductor layer.

6. The semiconductor device according to claim 1, wherein said second amorphous semiconductor layer is of said one conductivity type.

7. A semiconductor device as in claim 1 wherein said substantially intrinsic first amorphous layer is a layer formed by one of ion implantation, ion shower and plasma processing.

8. A semiconductor device as in claim 1 wherein there is a heterojunction interface between said substantially intrinsic first amorphous semiconductor layer and said second amorphous semiconductor layer in a region deeper than a deposition interface.

9. A semiconductor device comprising:

a crystalline semiconductor layer of a crystalline silicon semiconductor of one conductivity type;

a substantially intrinsic amorphized first amorphous semiconductor layer of an amorphous silicon semiconductor or a microcrystalline silicon semiconductor having dopant of the same kind and amount as that in said crystalline silicon semiconductor on the surface of said crystalline semiconductor layer;

a deposited second amorphous semiconductor layer of an opposite conductivity type of an amorphous silicon semiconductor or a microcrystalline silicon semiconductor on the first amorphous semiconductor layer;

a transparent electrode layer on said second amorphous semiconductor layer;

a substantially intrinsic amorphized third amorphous semiconductor layer of an amorphous silicon semiconductor or a microcrystalline silicon semiconductor having dopant of the same kind and substantially the same amount as that in said crystalline silicon semiconductor and located on the reverse surface of said crystalline semiconductor layer;

a deposited fourth amorphous semiconductor layer of said one conductivity type of an amorphous silicon semiconductor or a microcrystalline silicon semiconductor on the third amorphous semiconductor layer; and a back electrode layer on the fourth amorphous semiconductor layer.

10. A semiconductor device as in claim 9 wherein each of said substantially intrinsic first and third amorphous semiconductor layers is a layer formed by one of ion implantation, ion shower and plasma processing.

11. A semiconductor device as in claim 9 wherein there is a heterojunction interface between each of said substantially intrinsic first and third amorphous semiconductor layers and said second amorphous semiconductor layer each in a region deeper than a deposition interface.

* * * * *